July 18, 1961 A. GÖTZBERGER 2,993,155

SEMICONDUCTOR DEVICE HAVING A VOLTAGE DEPENDENT CAPACITANCE

Filed June 29, 1959

Inventor:
Adolf Götzberger
By [signature] Atty.

United States Patent Office 2,993,155
Patented July 18, 1961

2,993,155

SEMICONDUCTOR DEVICE HAVING A VOLTAGE DEPENDENT CAPACITANCE

Adolf Götzberger, Palo Alto, Calif., assignor to Siemens and Halske Aktiengesellschaft, Berlin and Munich, a corporation of Germany Filed June 29, 1959, Ser. No. 823,421
Claims priority, application Germany July 2, 1958
7 Claims. (Cl. 317—242)

This invention is concerned with a semiconductor device having a pn-junction, particularly a voltage dependent capacitance, comprising a semiconductor body the cross-sectional area of at least one of the semiconducting zones of which diminishes steadily or stepwise perpendicularly to the charge carrier flow, within the region of the space charge zone forming upon connection of the operating voltage to the device. The object of the invention is to make the capacitance of the pn-junction in predetermined desired manner dependent upon the blocking voltage connected thereto.

A pn-junction is in the p- and n-conducting regions in charge equilibrium. This equilibrium is however disturbed in the transition zone due to convection, holes moving from the p-region into the n-region and vice versa. Since the charges of the ionized acceptors and donators are locally bound and are not compensated in the transition zone by numerically equal presence of electrons and defect electrons, a space charge will form in the transition zone. When a voltage is in blocking direction placed on a pn-junction, the corresponding majority carriers are drawn off from the border layer, such layer losing charge carriers, and the space charge region widening dependent upon the blocking voltage. The space charge which is formed by the ionized donators and acceptors which are not compensated by moving charge carriers, is accordingly altered by the shifting of the moving electrons and holes, resulting in the formation of a voltage dependent capacitance of the pn-junction, the socalled blocking layer capacitance $C_S$. This capacitance depends upon the width of the space charge zone in the direction of the charge carrier flow and upon its area perpendicular to the charge carrier flow.

As has been indicated before, the object of the invention is to make the capacitance $C_S$ of a pn-junction in predetermined desired manner dependent upon the blocking voltage $U_S$.

As has also been indicated before, the invention proposes a semiconductor arrangement wherein the cross-sectional area of the semiconductor body in at least one of the semiconducting zones diminishes, within the region of the space charge zone forming responsive to connection of the operating voltage, steadily or stepwise in a direction extending perpendicular to the direction of the charge carrier flow.

In the arrangement proposed by the invention, the widening of the space charge zone in the direction of the charge carrier flow entails with changing blocking voltage an alteration of the area which limits the space charge zone perpendicularly to the charge carrier flow. Since the blocking layer capacitance $C_S$ depends upon the width of the space charge zone and the area limiting such zone, it is possible to obtain a desired capacitance course by suitable shaping of the cross section of the semiconductor body in the region of the space charge zone forming in the presence of the operating voltage.

The extent of the space charge zone in the semiconductor body is as known inversely proportional to the concentration of impurity centers in the corresponding region. The space charge zone accordingly penetrates the deeper the lower the impurity center concentration in the semiconductor. The invention therefore proposes that the semiconductor zone, which exhibits a diminution of the cross section, shall be intrinsically conductive or only very weakly doped within such zone, so as to obtain a space charge zone which extends far in the direction of the current flow.

Accordingly, if for example only one of the semiconducting zones exhibits reduction or diminution of the cross section, it is for obtaining a voltage dependence of the capacitance as high as possible, advantageous, to place this diminution in the high ohmic, that is, in the weakly doped and if desired intrinsically conductive region.

The various objects and features of the invention will appear from the description which will be rendered below with reference to the accompanying drawing in which.

Figure 1:
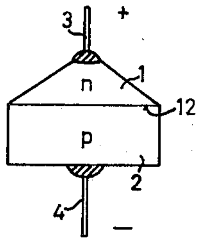
FIGS. 1 and 2 show embodiments of semiconductor devices.

FIG. 1 shows a semiconductor device in which the cross section of the semiconductor zone diminishes steadily or gradually from the pn-junction to the terminal contact. The n-conducting region 1 is assumed to be high ohmic, that is, for example, weakly n-doped particularly in the region in which is in the presence of operating voltage formed a space charge zone while the p-zone 2 is doped stronger and therefore low ohmic. Upon placing a blocking voltage $U_S$ on the terminals 3 and 4, one border of the space charge zone will move into the high ohmic region, the corresponding border area of the space charge zone diminishing and the capacitance accordingly decreasing. It is understood, of course, that both zones 1 and 2 may exhibit a diminution of the cross sectional area perpendicular to the charge carrier flow.

Figure 2:
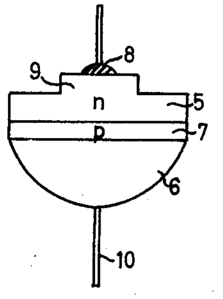

FIG. 2 shows an embodiment of a semiconductor device with stepped configuration. A preferably disk-shaped semiconductor body 5 which, for example, is of the n-conduction type, exhibits a stepwise diminution 9 of its cross sectional area, which lies within the region of the space charge zone forming in the presence of operating voltage. Numeral 8 indicates an ohmic contact. The zone 7 which is in the assumed example of the p-conduction type, is provided upon the semiconductor body 5 throughout the cross sectional extent thereof, particularly by alloying-in the acceptor material 6.

Figure 3:
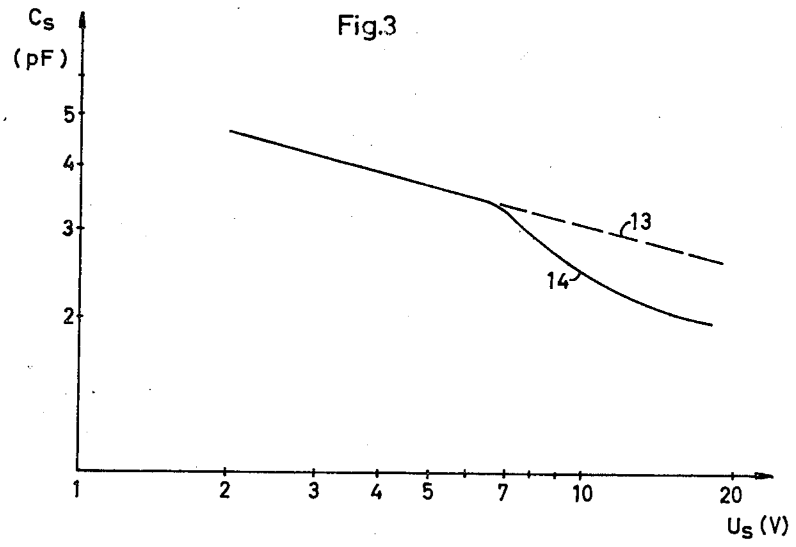
FIG. 3 shows a performance curve obtained in the case of a device according to FIG. 2.

FIG. 3 shows the curve 14 obtained by measurements from the device illustrated in FIG. 2. Upon the ordinate is entered the blocking layer capacitance $C_S$ in picofarad and upon the abscissa appears in terms of volts the blocking voltage $U_S$ placed on the terminals 8 and 10. A logarithmic scale has been used for both coordinates. The curve 13 shows for the sake of comparison the course of the capacitance $C_S$ in dependence upon the blocking voltage $U_S$, as it will result for a pn-junction with uniform cross section in both zones (p- and n-zone) within the space charge zone.

Changes may be made within the scope and spirit of the appended claims which define what is believed to be new and desired to have protected by Letters Patent.

I claim:

1. A semiconductor device having a pn-junction, especially a voltage dependent capacitance, comprising a semiconductor body the cross sectional area of which diminishes perpendicularly to the direction of the charge carrier flow along a semiconducting zone within the region of the space charge zone forming in the presence of operating current connected thereto, the semiconductor zone which exhibits said diminution of cross sectional area being relatively very weakly doped so as to obtain a space charge zone extending within such semiconductor zone for a considerable extent in the direction of current flow.

2. A semiconductor device according to claim 1, wherein said cross sectional area diminishes gradually.

3. A semiconductor device according to claim 1, wherein said cross sectional area diminishes stepwise.

4. A semiconductor device having a pn-junction, especially a voltage dependent capacitance, comprising a semiconductor body the cross sectional area of which diminishes perpendicularly to the direction of the charge carrier flow along a semiconducting region of the space charge zone forming in the presence of operating current connected thereto, the semiconductor zone which exhibits said diminution of cross sectional area being intrinsically conductive so as to obtain a space charge zone extending within such semiconductor zone for a considerable extent in the direction of current flow.

5. A semiconductor device according to claim 4, comprising a terminal contact, the cross sectional area of said semiconductor zone diminishing steadily from the pn-junction in the direction of said terminal contact.

6. A semiconductor device according to claim 1, comprising a terminal contact, the cross sectional area of said semiconductor zone diminishing steadily from the pn-junction in the direction of said terminal contact.

7. A semiconductor device according to claim 1, comprising a generally disk-shaped semiconductor body of predetermined conduction type, said body exhibiting a stepped diminution of its cross sectional area, forming a cross sectionally reduced portion, an ohmic contact disposed upon said portion, and a zone with predetermined other conduction type extending along the opposite side of said body which faces away from said portion, throughout the entire cross sectional extent of such opposite side, and being alloyed thereinto by acceptor material.

References Cited in the file of this patent

UNITED STATES PATENTS

| | | |
|---|---|---|
| 2,879,190 | Logan et al. | Mar. 24, 1959 |
| 2,904,704 | Marinace | Sept. 15, 1959 |
| 2,913,676 | Pankove | Nov. 17, 1959 |